United States Patent [19]

Chiao

[11] Patent Number: 4,503,601
[45] Date of Patent: Mar. 12, 1985

[54] OXIDE TRENCH STRUCTURE FOR POLYSILICON GATES AND INTERCONNECTS

[75] Inventor: Samuel Y. Chiao, Fort Collins, Colo.

[73] Assignee: NCR Corporation, Dayton, Ohio

[21] Appl. No.: 486,275

[22] Filed: Apr. 18, 1983

[51] Int. Cl.$^3$ ............................................. H01L 21/26
[52] U.S. Cl. .................... 29/571; 29/576 W; 29/576 B; 29/577 C; 148/1.5
[58] Field of Search .................... 29/571, 576 W, 591; 357/23 HV, 23 S, 23 CS, 23 VD, 59, 71 P

[56] References Cited

U.S. PATENT DOCUMENTS

| | | | |
|---|---|---|---|
| 4,080,719 | 3/1978 | Wilting | 29/591 |
| 4,234,362 | 11/1980 | Riseman | 148/187 |
| 4,330,931 | 5/1983 | Liu | 29/571 |
| 4,344,222 | 8/1982 | Bergeron et al. | 27/571 |
| 4,366,613 | 1/1983 | Ogura et al. | 29/571 |
| 4,404,733 | 9/1983 | Sasaki | 29/591 |
| 4,441,247 | 4/1984 | Gargini et al. | 29/571 |

FOREIGN PATENT DOCUMENTS 14379 2/1977 Japan .................... 357/235

OTHER PUBLICATIONS

Takeda et al., "Submicrometer MOSFET Structure for Minimizing Hot-Carrier Generation," IEEE Transaction on Electron Devices, vol. ED-29, No. 4, pp. 611–618, Apr. 1982.

Ogura et al., "Design and Characteristics of the Lightly Doped Drain-Source (LDD) Insulated Gate Field-Effect Transistor," Journal of Solid State Circuits, vol. SC-15, No. 4, pp. 424–432, Aug. 1980.

H. Sunami and M. Koyanagi, "Selective Oxide Coating of Silicon Gate (SELOCS)", *Japanese Journal of Applied Physics*, vol. 18, (1979), Supplement 18-1, pp. 255–260.

*Primary Examiner*—Aaron Weisstuch
*Assistant Examiner*—Hunter L. Auyang
*Attorney, Agent, or Firm*—J. T. Cavender; Casimer K. Salys; T. Rao Coca

[57] ABSTRACT

Disclosed is a manufacturing method of forming silicon gate, self-aligned MOS-type devices having submicron dimensions. After forming the gate from a highly doped polysilicon layer using a mask, the structure is subjected to a low temperature (700–750 degrees C.) thermal oxidation. Due to enhanced oxidation rate of doped silicon surfaces, a very thick oxide layer over the polysilicon gate sidewalls and a relatively thin oxide layer over the source-drain regions of the substrate are formed. The mask over the polysilicon and the oxide layer over the source-drain regions is removed and source-drain implantation is accomplished followed by selective deposition of metal (e.g. tungsten) over the source-drain regions and the polysilicon gate.

In an alternative embodiment of this process, after forming the highly doped polysilicon gate using a mask, lightly doped source-drain regions which are self-aligned and in registry with the gate are formed by ion implantation. Then, low temperature thermal oxidation is accomplished growing a thick oxide over the polysilicon gate sidewalls and a thin oxide over the source-drain regions. The mask over the gate and the thin oxide over the source-drain regions is removed and by ion implantation heavily doped source-drain regions are formed in the previously formed lightly doped source-drain regions not masked by the polysilicon sidewall oxide. Selective deposition of a metal is then accomplished over the source-drain regions of the silicon substrate and the polysilicon gate.

4 Claims, 9 Drawing Figures

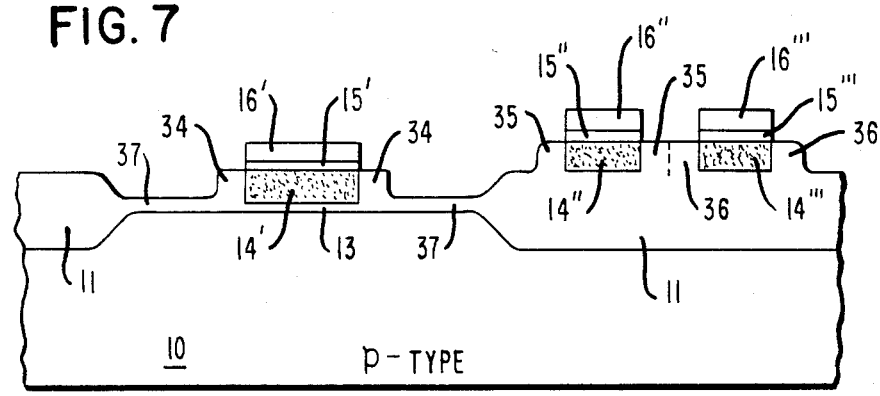
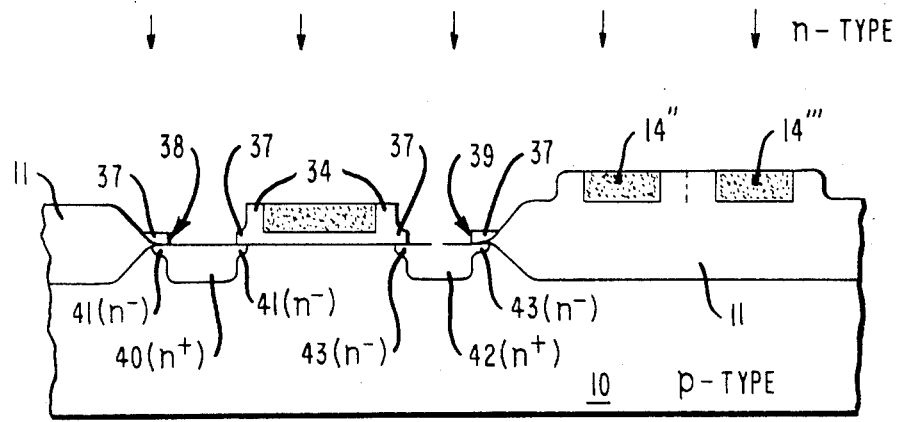
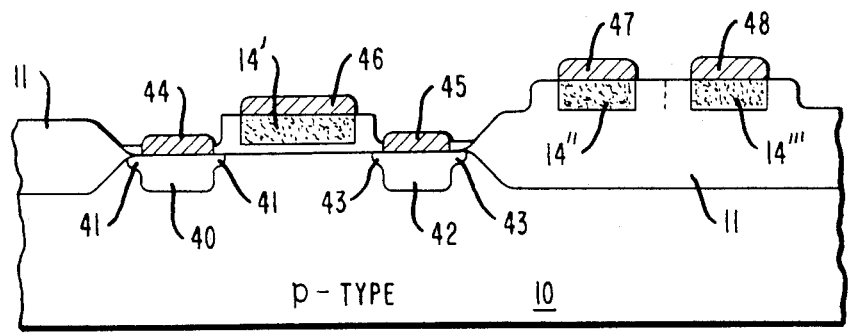

OXIDE TRENCH STRUCTURE FOR POLYSILICON GATES AND INTERCONNECTS

BACKGROUND OF THE INVENTION

This invention relates to a manufacturing method of semiconductor devices and more particularly to MOS-type devices which have extraordinarily small dimensions.

During the past several years there has been a continuing trend toward the development of semiconductor devices having extraordinarily small dimensions of the order of 1 micron or less to increase the packing density of devices on an integrated circuit chip. Particularly in the area of MOS memories, gate widths and associated interconnect dimensions continue to be scaled down to increase not only the circuit density on the chip but also to improve the circuit performance (by increased operational speeds, etc.). As these dimensions continue to decrease, several problems, which significantly reduce yields and thereby offset the cost savings achieved by higher packing density, become manifest. One of these problems is hot-carrier (i.e. hot-electron or hot-hole) injection from the channel region into the gate oxide due to very high electric field intensities in a narrow channel region adjacent the drain. Such charge injection into the gate oxide and the subsequent trapping of these charges therein will cause device instabilities such as threshold-voltage shift and transconductance degradation.

Another problem encountered in manufacturing small geometry MOS devices relates to electrical shorts between interconnecting conductors such as the electrical conductor contacting the self-aligned gate, source and drain. To elaborate on this point, in the fabrication of silicon gate MOS devices after forming the polysilicon gate structure and the source-drain regions in correspondence with the gate structure, a metal such as tungsten is selectively deposited over the polysilicon gate and the source-drain regions of the silicon substrate to provide low resistance conductor lines. However, the metal deposited in this manner invariably forms a shroud around the polysilicon gate which tends to create an electrical short with the metal deposited over the adjacent source-drain regions. A similar shorting problem exists between adjacent closely-spaced polysilicon interconnect lines.

To alleviate the first of the above problems, a lightly doped drain-source (LDD) structure has been proposed. In a LDD n-MOSFET structure, for example, very shallow, self-aligned lightly doped $n^-$ regions are introduced between the channel and the heavily doped, less shallow $n^+$ source-drain diffusions. This structure increases breakdown voltage and reduces impact ionization (and thus hot-electron emission) by spreading the high electric field at the drain pinchoff region into the $n^-$ region.

One method of fabricating LDD structures is by using the sidewall spacer approach in conjunction with the state-of-the-art etching techniques such as anisotropic (and selective) reactive ion etching (RIE). Reference is now made to the publication entitled "Fabrication of High Performance LDD FET's With Oxide Sidewall-Spacer Technology" by P. J. Tsang et al. and published in IEEE Transactions on Electron Devices, Vol. ED-29, No. 4, April, 1982, pp. 590–596, which teaches a method of forming the LDD n-MOS FET. In this method, after forming the polysilicon gate structure consisting of the gate oxide, the polysilicon gate and an $SiO_2$ etch mask, n-type ion (e.g., phosphorus) implantation is accomplished to form the lightly-doped source-drain regions. A layer of CVD $SiO_2$ of a desired thickness is then conformally deposited and, using directional vertical RIE, the planar portion of the CVD oxide is removed. As a result of this etch, an oxide sidewall spacer is left abutting the polysilicon gate structure where the deposited oxide is thicker in the vertical direction. Following the formation of the sidewall spacer, arsenic ion-implantation is used to form the $n^+$ regions of source and drain.

In the Tsang et al. process, since the oxide mask over the polysilicon gate is not removed during the RIE, it would appear that a subsequent etching step to remove the oxide mask will considerably thin down the oxide sidewall spacer. Consequently, upon forming the metal over the polysilicon and the substrate regions corresponding to the source and drain, by selective deposition, for example, the device is prone to shorting problems discussed previously.

Reference is now made to U.S. Pat. No. 4,330,931, issued on May 25, 1982, to Liu which discloses a process for forming a self-aligned silicon gate n-MOSFET having $n^-$ source-drain extensions. In this process after forming the polysilicon gate having a nitride overhang mask, arsenic ions are implanted to form the $n^+$ source and drain. During this implant step, lightly doped source-drain extensions are also formed due to blocking of some ions by the nitride overhangs. The structure is then subjected to a high temperature (920 degrees C.) oxidation step to grow a 1000 Angstroms thick oxide over the sides of the polysilicon gate and the substrate corresponding to the source-drain regions. The oxide thus formed over the $n^+$ source-drain regions is then damaged by argon ion bombardment. During this oxide damaging step, the oxide over the $n^-$ source-drain regions and the sidewalls of the gate is protected by the nitride mask. The damaged oxide and the nitride mask are then removed and a tungsten layer is selectively deposited over the exposed $n^+$ source-drain regions and the gate.

The Liu process requires an oxide damaging step which is not only an extra process step but also requires very careful control lest the source-drain areas may also be damaged. Both of these requirements are particularly disadvantageous from a high volume manufacturing standpoint. Another disadvantage is that this process requires forming a nitride overhang mask atop the polysilicon by undercutting the polysilicon. This is a critical process step and is very difficult to control. Further, any variation in undercutting the polysilicon may cause possible damage to the sidewall oxide during argon ion bombardment. Yet another disadvantage of the Liu process is that this process appears to be limited to forming a very thin (1000 Angstroms thick) polysilicon gate sidewall oxide. Consequently, upon selective deposition of tungsten over the polysilicon gate and the source-drain areas, adjacent tungsten strips may short each other out due to tungsten spiking.

It is an object of the present invention to prevent the aforementioned shorting between closely-spaced adjacent metal conducting lines.

It is another object of this invention to provide a controllable and reproducible manufacturing process of forming a short channel MOS device having a graded doping profile source-drain regions for minimizing hot-carrier effects.

SUMMARY OF THE INVENTION

In accordance with the present invention, an improved process of forming short channel, self-aligned silicon gate MOS devices wherein a relatively thick insulating layer is formed on the sidewalls of polysilicon gate (and other conductors). In a preferred embodiment of the invention, a relatively thin gate oxide layer is formed on the surface of a semiconductor silicon substrate. A very highly doped polysilicon conductive layer is formed to overlie the gate oxide layer followed by a masking layer over the polysilicon. The polysilicon is etched in the presence of the masking layer into a gate electrode and interconnects. The gate oxide layer outside the gate area is then removed. Lightly doped (e.g. $n^-$) source and drain regions in self-aligned relationship with the gate are then formed by ion implantation. The structure is then subjected to a low temperature (700-750 degrees C.) oxidation step for a period of time to profusely grow oxide from the unmasked sidewalls of the polysilicon gates and interconnects. During this oxidation step, a thin oxide layer (about one-tenth to one-fifth of the thickness of polysilicon sidewall oxide) is formed over the source-drain regions of the silicon substrate. The masking layer over the gate and interconnects and the thin oxide over the lightly doped source-drain is then etched off and using the thick polysilicon gate sidewall oxide as a mask, heavily doped ($n^+$) source-drain regions abutting the lightly doped ($n^-$) source-drain regions are then formed by ion implantation. Next, a metal, such as tungsten, is selectively deposited over the exposed source-drain regions of the silicon substrate and the polysilicon gate and interconnects.

BRIEF DESCRIPTION OF THE DRAWINGS

FIGS. 1, 3 and 7-9 are cross-sectional representations of forming an LDD n-MOSFET using an alternative process of the present invention.

DETAILED DESCRIPTION OF THE PREFERRED EMBODIMENT

The process of forming a sidewall oxide (or oxide trench) structure for silicon gates and interconnections in accordance with the present invention will now be described with reference to forming a LDD FET, more specifically, a LDD n-MOSFET. It should be noted that many of the techniques for implementing the various individual steps of the fabrication method are well-known in the art and may be implemented in a number of different ways which are readily apparent to those of ordinary skill in the art.

Figure 1:
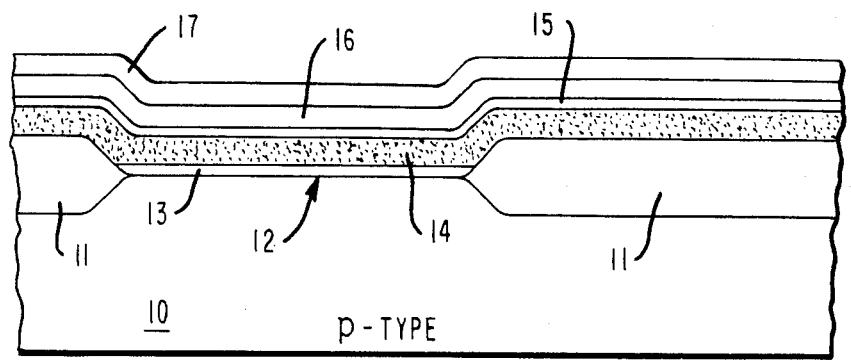
FIGS. 1-6 are flow diagrams illustrating by sequential cross-sectional representation the process of the present invention for forming a LDD n-MOSFET with polysilicon gate electrode and interconnecting conductors of a single high conductivity and single impurity type.

Referring now to FIG. 1, the starting material is a slice of p-type monocrystalline semiconductor grade silicon. The starting material can be either (111) or (100) orientation and has a bulk resistivity typically of about 8-20 ohm-cm. In the figures, the substrate 10 represents only a very small undivided part of the slice, perhaps less than 15 microns wide for each part. After appropriate cleaning of the slice, the semi-recessed oxide (commonly referred to as field isolation oxide) regions 11—11 are formed in a conventional manner. The oxide regions 11—11, which are typically about 5,000-15,000 Angstroms (0.5-1.5 microns) thick, define the device active region and provide dielectric isolation between devices formed on the semiconductor slice. One such device active region is shown in FIG. 1 and designated by numeral 12. Active region 12 is then subjected to suitable ion implantation to adjust the threshold voltage of the LDDFET to be formed thereon to the desired value.

Next, a clean and high-quality silicon dioxide layer 13 is formed over the entire structure by conventional techniques such as oxidation of the substrate 10 in an HCl/O$_2$ environment at a temperature of about 900-1000 degrees C. Oxide layer 13 serves as the gate insulator for the LDDFET and is typically about 100-500 Angstroms (0.01-0.05 microns) thick.

Thereafter, a polycrystalline silicon layer 14 of thickness 2,000-5,000 Angstroms (0.2-0.5 microns) is formed over the entire structure by low pressure chemical vapor deposition (LPCVD). The term polycrystalline is used to include amorphous or near-amorphous as well as truly polycrystalline structure. The polysilicon layer 14 is then heavily doped by a conventional doping technique. One example of polysilicon 14 doping step is phosphorus oxychloride (POCl$_3$) deposition and thermal diffusion such that the phosphorus concentration in the polysilicon layer 14 is about $10^{20}$-$10^{21}$ atoms per cm$^3$. Another example of polysilicon 14 doping is by ion implantation of arsenic ions into the polysilicon layer. As a result of this high dopant concentration profile, the sheet resistance of polysilicon layer 14 will be in the range of 10-14 ohms per square. Doping the polysilicon layer 14 to a high concentration level is essential not only for providing a high conductivity to the polysilicon gates and interconnects that will be formed from layer 14 but also to enable forming a thick oxide sidewall structure abutting the polysilicon gates and interconnects as will be fully discussed hereinbelow.

The next step of the present process is forming a masking layer over the polysilicon 14. One approach to forming this masking layer is conversion of the upper surface of polysilicon layer 14 by thermal oxidation into a layer of silicon dioxide 15 or deposition of oxide layer 15 onto the upper surface of the polysilicon layer 14 to a thickness of about 150 Angstroms (0.015 microns). A layer of silicon nitride 16 is then formed over the silicon dioxide layer 15 using conventional processing techniques such as CVD using a silicon containing gas and ammonia reactants. The layer of nitride 16 is typically about 1000-1800 Angstroms (0.1-0.18 microns) thick. The silicon dioxide layer 15 not only serves as a pad between the polysilicon layer 14 and the nitride 16 and prevents damage to the underlying polysilicon 14 by minimizing the stresses created on the polysilicon 14 by the silicon nitride-polysilicon interface but also aids in the eventual removal of the nitride layer 16. The nitride 16 serves as an oxidation mask during subsequent oxidation steps of the present process.

Another approach to forming the mask over the polysilicon 14 omits the pad oxide 15 and forms the nitride layer 16 directly over the polysilicon layer 14 by injecting nitrogen atoms into an upper surface layer of polysilicon 14 and thereby converting this surface layer into silicon nitride. In this technique, a nitrogen dose of about $5 \times 10^{15}$ atoms per square cm may be utilized for converting a 300-800 Angstroms (0.03-0.08 microns)

thick upper layer of polysilicon 14 into silicon nitride 16.

Figure 2:
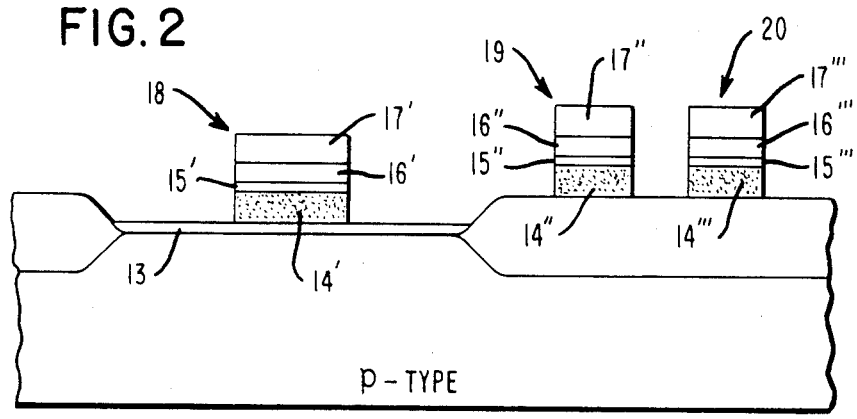

Referring to FIGS. 1 and 2, conventional photolithographic and etching techniques are then used to pattern the nitride layer 16, oxide layer 15 and polysilicon layer 14 into the desired combination of gate structures and interconnecting conductor structures. This includes forming a photoresist layer 17 of typical thickness in the range 6,000–10,000 Angstroms (0.6–1 micron) over the entire surface of the nitride 16 and then exposing the photoresist to ultraviolet or similar radiation through a mask which defines the desired pattern of gates and interconnecting conductors. The photoresist is then removed by using a suitable solvent exposing the areas where the nitride is to be etched away. The nitride layer 16 is then etched using the overlying photoresist as a mask by conventional etching techniques such as plasma etch. The oxide 15 and polysilicon 14 are then etched using the overlying photoresist-nitride dual layer and photoresist-nitride-oxide triple layer, respectively, as a mask. A gate structure 18 corresponding to the device active area 12 and two interconnecting conductor structures on the top of the isolation oxide 11 and designated by numerals 19 and 20 formed in this manner are shown in FIG. 2. In structures 18, 19 and 20, the various parts designated by single, double and triple primed numerals represent the portions of the layers designated by the unprimed numerals (FIG. 1) from which they were formed. For example, 17" represents the portion of the photoresist mask layer 17 corresponding to the interconnect structure 19; 14''' represents the polysilicon interconnect formed from the polysilicon layer 14 corresponding to the interconnect structure 20.

After patterning the device gate and interconnect structures in the manner indicated above, referring to FIG. 2, the photoresist masks 17', 17" and 17''' for the various structures is removed. Next, the oxide layer 12 not masked by the overlying gate structure 14'-15'-16' is removed by dipping the slice in a dilute hydrofluoric acid etchant solution. In other words, as shown in FIG. 3, the oxide layer 13 is removed over the source and drain areas of the transistor and defined into gate oxide 13'.

Figure 3:
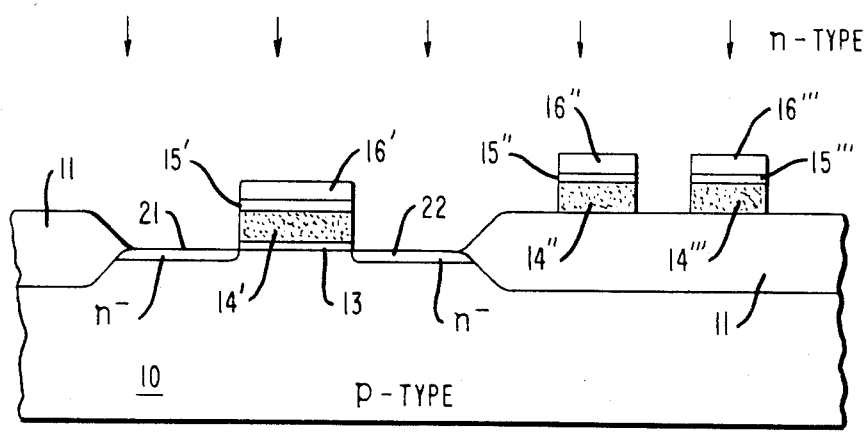

As shown in FIG. 3, the structure is then subjected to a light doping step using n-type ions to form the lightly doped n$^-$ source and drain regions 21 and 22, respectively. This doping step may, typically, be accomplished by using arsenic ions of energy 70 keV and dose $(1–10) \times 10^{13}$ ions per square cm. The lightly doped source and drain regions 21 and 22, respectively, are shallow and typically of junction depth less than 0.1 microns.

Figure 4:
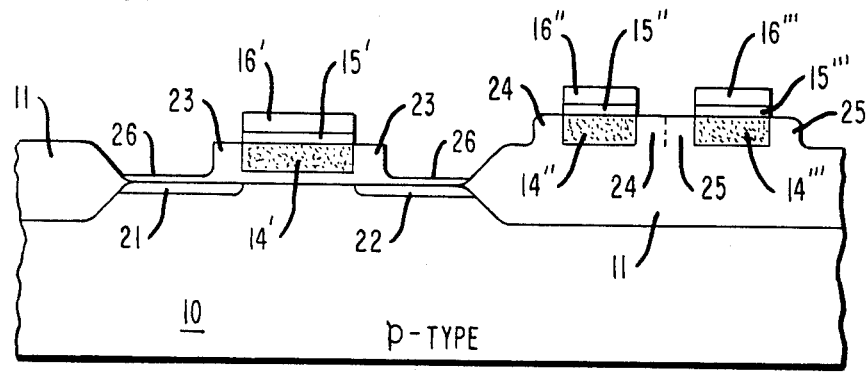

The next step of the fabrication process is low temperature steam oxidation of the entire structure. The temperature selected for this oxidation step is in the range of 700–750 degrees C. and the time of oxidation is about 1–4 hours. Referring to FIG. 4, during this low temperature oxidation step, the unmasked side surfaces of doped polysilicon gate 14' and interconnecting conductors 14" and 14''' and the exposed regions of the silicon substrate 10 will be oxidized. As a result of this oxidation step, sidewall oxide regions 23–23, 24–24 and 25–25 will be formed corresponding to the polysilicon gate 14', interconnecting lines 14" and 14''', respectively. Since the growth rate of silicon dioxide from the heavily doped polysilicon is significantly greater than that of the undoped or lightly doped silicon, the thickness of the oxide formed on the side surfaces of the polysilicon gate 14' and interconnecting conductors 14" and 14''' will be much greater than that of the oxide layer 26 formed over the source and drain regions of the silicon substrate. The thickness ratio of the oxide grown on the side surfaces of the polysilicon to the oxide grown over the source and drain regions of the substrate is a function of such parameters as the crystal orientation of the silicon substrate (in general, the growth rate for (111) surface is about 10–20% higher than that for (100) surface), the relative dopant concentrations in the polysilicon and silicon substrate (for example, the thickness of the oxide grown on polysilicon doped to a concentration level of $10^{20}$–$10^{21}$ atoms/cm$^3$ is six to eight times the thickness of the oxide grown on undoped (100) silicon surface), oxidation temperature (as the oxidation temperature becomes lower the difference in oxidation rate between doped polysilicon and undoped silicon increases) and pressure at which the oxidation is carried out (oxidation rate becomes greater with increasing ambient pressure). In a specific example of the present polysilicon sidewall oxidation technique, using a (100) silicon substrate 10 having a polysilicon gate 14' of dopant (phosphorus) concentration of $10^{20}$–$10^{21}$ atoms/cm$^3$ and n$^-$ regions 21 and 22 of dopant (arsenic) concentration of $10^{16}$–$10^{18}$ atoms/cm$^3$, the thicknesses of the polysilicon sidewall oxide 23—23 and the oxide layer 26 formed over the substrate when the structure was subjected to an oxidation step at ambient pressure and temperature of about 750 degrees C. for a period of three hours were 2,700 Angstroms (0.27 microns) and 440 Angstroms (0.044 microns), respectively. In other words, the thickness of the polysilicon sidewall oxide 23—23 was approximately six times the thickness of the oxide layer 26.

Referring to FIG. 4, following the low temperature oxidation step to form the oxide sidewalls extending from the unmasked side surfaces of the polysilicon gate 14' and interconnects 14" and 14''', the nitride-oxide dual mask 16'-15', 16"-15" and 16'''-15''' corresponding to the polysilicon gate 14', interconnects 14" and 14''', respectively, and the oxide layer 26 over the source and drain regions of the substrate is etched off by conventional techniques such as plasma etch or concentrated phosphoric acid etch at a temperature of 150 degrees C. for removal of the nitride and dilute hydrofluoric acid etch for removal of the oxide. During the just-mentioned oxide etch step a small portion of the polysilicon sidewall oxide is also removed, but since the sidewall oxide thickness is quite large to begin with, this will not have any deleterious effect on the final intended structure.

Figure 5:
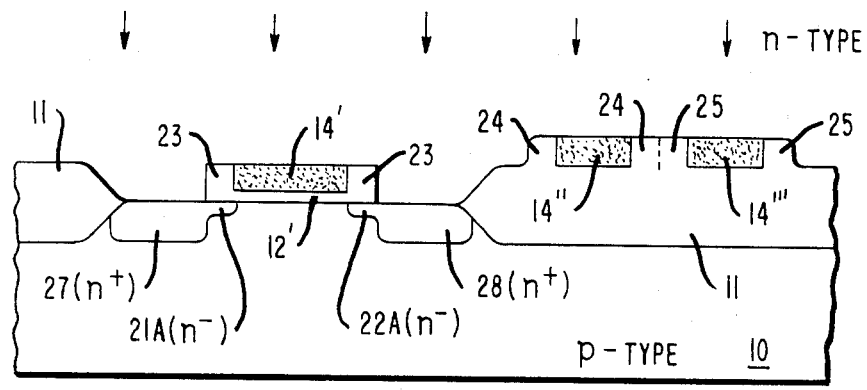

Next, referring to FIG. 5, an n-type ion implantation step is carried out to form the heavily doped n$^+$ source and drain regions 27 and 28, respectively. Preferably, arsenic is used as the dopant during this implantation step since it has relatively heavy mass and produces a shallow junction. Typical arsenic ion dose and energy for forming n$^+$ source and drain regions 27 and 28, respectively, are $5 \times 10^{15}$–$10^{16}$ ions per square cm and 80 keV, respectively. During this implantation step, the oxide sidewalls 23—23 extending from the polysilicon gate 14' will mask the underlying lightly doped n$^-$ source and drain regions 21A and 22A, respectively. In other words, the heavily doped n$^+$ source and drain regions 27 and 28 will be spaced away from the channel region by a distance equal to the polysilicon sidewall 23 thickness. Electrical connection of the heavily doped source and drain regions 27 and 28 to the channel regions of the substrate is made via the lightly doped source and drain regions 21A and 22A, respectively. In this manner, a self-aligned gate LDD n-MOSFET structure is conveniently formed.

The next step in the present fabrication process is a thermal anneal step in nitrogen or argon gas at a temperature of about 1000 degrees C. for a period of 1–2.5 hours to drive-in the arsenic ions introduced into the heavily doped source and drain regions 27 and 28, respectively. At the completion of this anneal step, typical junction depth of the n+ regions 27 and 28 will be in the range of 0.1–0.5 microns. The junction depths of the n− regions 21A and 22A will be significantly less than the junction depth of the n+ regions 27 and 28.

Figure 6:
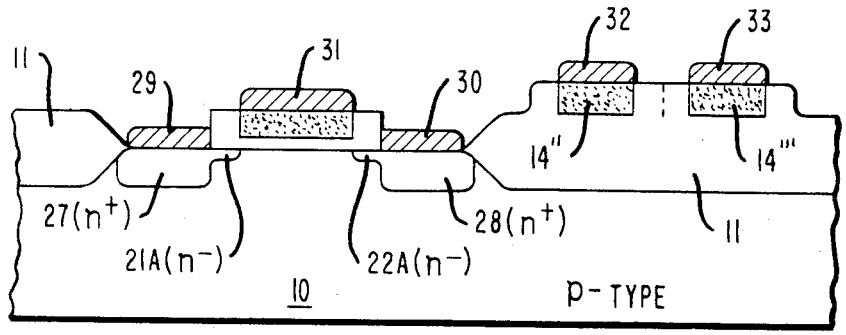

Next, referring to FIG. 6, a metal such as tungsten is selectively deposited, for example, by chemical vapor deposition using gaseous tungsten hexafluoride (WF$_6$) as donor over all the exposed areas of the silicon substrate 10 and the polysilicon members 14', 14" and 14'" to a thickness of about 1000–2000 Angstroms. It can be appreciated that during this selective deposition step, no tungsten will be formed over the oxide regions. The tungsten conducting members formed in this manner and making electrical contact with the source 21A–27, drain 22A–28, polysilicon gate 14' and interconnects 14" and 14'" are shown in FIG. 6 and designated by numerals 29, 30, 31, 32 and 33, respectively. Other metals that are suitable for substitution in place of tungsten are refractory metal silicides such as tungsten silicide.

An alternative method of forming a LDD n-MOSFET in accordance with the present invention is illustrated in FIGS. 1–2 and 7–9. The steps of this alternative method are as follows:

Referring to FIG. 2, after removing the photoresist mask members 17', 17" and 17'" corresponding to the polysilicon gate and interconnects 14', 14" and 14'", respectively, the structure is subjected to a low temperature (700–750 degrees C.) oxidation step for a period of 1–4 hours forming the polysilicon sidewalls 34—34, 35—35 and 36—36 corresponding to the gate and interconnects 14', 14" and 14'", respectively (see FIG. 7). During this low temperature oxidation step the thickness of the oxide layer 13 outside the gate area will increase by about one-sixth of the polysilicon sidewall oxide (e.g. sidewall 34—34) thickness. This oxide layer outside the gate area is designated by numeral 37.

Thereafter, referring to FIG. 8, openings 38 and 39 are made in a central portion of the oxide layer 37 to expose a portion of the source and drain regions of the underlying substrate. Next, the nitride-oxide members 16'-15', 16"-15" and 16'"-15'" over the polysilicon gate 14' and interconnects 14" and 14'" are removed.

Referring to FIG. 8, then an n-type ion implantation step is accomplished using, typically, arsenic ions of energy 20 to 80 keV and dose $10^{20}$–$10^{21}$ atoms per square centimeter to form a graded dopant profile for source and drain regions designated by numeral pairs 40–41 and 42–43, respectively, each consisting of a shallow n+ region (40, 42) surrounded by a much less shallow n− region (41, 43) and self-aligned with the gate. The n+ regions 40 and 42 are formed due to direct implantation of n-type ions into the substrate through the openings 38 and 39 in the oxide layer 37. The n− regions 41 and 43 are formed by the n-type ions which penetrate the oxide barrier layer 37. The n− regions are more shallow than the n+ regions since a part of the energy of the implanted ions is absorbed by the oxide layer 37, thereby decreasing the ions' penetration depth.

The graded dopant profile source 40–41 and drain 42–43 formed in this manner is spaced from the gate 14' by the thickness of the oxide sidewall 34—34 since the sidewall 34 prevents any ions from reaching the substrate thereunder during the source-drain ion implantation step.

Referring to FIG. 9, after forming the source and drain regions, a metal such as tungsten is selectively deposited over the polysilicon gate 14' and interconnects 14" and 14'" and the exposed source and drain regions of the substrate in a manner discussed previously in connection with FIG. 6. The metal conducting members formed in this fashion and establishing electrical contact with the source 40–41, drain 42–43, polysilicon gate 14' and interconnects 14", 14'" are shown in FIG. 9 under the designation of numerals 44–48, respectively.

The processing at this point is substantially complete as far as the novelty of the present invention is concerned. The balance of the processing is conventionally performed.

By using the above process it is possible to fabricate semiconductor MOS-type devices having polysilicon gates and interconnects having a width in the range of 1–5 microns or less and source-drain regions as small as 1–3 microns on a side. Since the various polysilicon conductors are effectively insulated by thick oxide sidewall or trench structure, short-circuiting between adjacent conductors is prevented. The relative closeness of the interconnecting conductors is determined by the photolithographic limitations. Using conventional optical lithography in combination with the present process it is possible to space the interconnects as close as 1 micron apart. By using X-ray lithography in conjunction with the present process, the spacing between the interconnects can be reduced to much below 1 micron. Since the short-circuiting between adjacent conductors is prevented, the present process provides a semiconductor device with improved reliability and yield of production. Also, this process is conducive for fabrication of LDD MOSFETs which are free from the debilitating short channel side effects such as drain punch-through to which scaled down devices are prone.

While this invention has been described with reference to illustrative embodiments, this description is not to be construed in a limiting sense. Various modifications of the illustrated embodiments as well as other embodiments of the invention will be apparent to persons of ordinary skill in the art upon reference to this description. It is therefore contemplated that the appended claims will cover any such modification or embodiment as fall within the true scope and spirit of this invention.

I claim:

1. A process for forming a metal covered high conductivity region of a substrate and a metal covered polysilicon conductor in close proximity to said region, said process comprising:

forming said polysilicon conductor on selected portions of said substrate from a highly doped polysilicon layer having a masking member thereon;

thermally oxidizing at a relatively low temperature in the range of 700–750 degrees C. for a time sufficient to form a relatively thick oxide layer on the side surfaces of said polysilicon conductor and a relatively thin oxide layer on the uncovered portions of said substrate;

removing the relatively thin oxide layer on said uncovered portions of said substrate;

doping said uncovered portions of said substrate to a high conductivity;

removing the masking member to expose the upper surface of said polysilicon conductor; and forming a metal layer over said exposed, highly doped portion of said substrate and polysilicon conductor.

2. The process as in claim 1 wherein said masking member is a layer of silicon nitride.

3. A process for forming a lightly doped drain polysilicon gate n-MOSFET on a p-type semiconductor silicon substrate having an active region covered by a relatively thin silicon dioxide layer, said process comprising:

forming a highly doped polysilicon layer over th silicon dioxide layer;

forming a mask over the polysilicon;

patterning the polysilicon in the presence of a mask to form a polysilicon gate on said active region;

removing said oxide layer outside a gate region dfined by said gate on the active region;

implanting n-type ions at a relatively low dose and energy in source and drain regions defined in said active region by the gate and mask thereon;

thermally oxidizing at a relatively low temperature of about 700–750 degrees C. for a time sufficient to form a relatively thick oxide layer on the side surfaces of said polysilicon gate and a relatively thin oxide layer in the previously defined source and drain regions of the substrate;

removing said mask over the polysilicon and said thin oxide over the source and drain regions;

implanting n-type ions of a relatively high dose and energy in said source and drain regions not masked by said thick oxide and said polysilicon gate; and selectively depositing a metal layer over the exposed polysilicon gate and the source and drain regions.

4. The process as recited in claim 3 further comprising the steps of:

patterning the polysilicon in the presence of the mask to form interconnecting conductors simultaneously with the patterning of the polysilicon into a gate;

forming a thick oxide layer on the side surfaces of the conductors during said thermal oxidation step; and selectively depositing a metal layer over the polysilicon interconnects during said metal deposition step.

* * * * *